(12) United States Patent
Cabral, Jr. et al.

(10) Patent No.: US 6,927,117 B2
(45) Date of Patent: Aug. 9, 2005

(54) METHOD FOR INTEGRATION OF SILICIDE CONTACTS AND SILICIDE GATE METALS

(75) Inventors: Cyril Cabral, Jr., Ossining, NY (US);
Jakub T. Kedzierski, Peekskill, NY (US); Victor Ku, Tarrytown, NY (US);
Christian Lavoie, Ossining, NY (US);
Vijay Narayanan, New York, NY (US); An L. Steegen, Stanford, CT (US)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 10/725,851

(22) Filed: Dec. 2, 2003

(65) Prior Publication Data

US 2005/0118757 A1    Jun. 2, 2005

(51) Int. Cl.⁷ .......................................... H01L 21/8238
(52) U.S. Cl. ..................................................... 438/233
(58) Field of Search ................................ 438/199, 229, 438/230, 231, 232, 233, 275, 299

(56) References Cited

U.S. PATENT DOCUMENTS

| | | | | |
|---|---|---|---|---|
| 4,780,429 A | * | 10/1988 | Roche et al. ................ | 438/237 |
| 4,908,332 A | * | 3/1990 | Wu ............................. | 438/297 |
| 5,874,769 A | * | 2/1999 | Chan et al. .................. | 257/510 |
| 5,953,612 A | * | 9/1999 | Lin et al. ..................... | 438/299 |
| 5,966,597 A | * | 10/1999 | Wright ........................ | 438/197 |
| 6,074,921 A | * | 6/2000 | Lin ............................. | 438/299 |
| 6,093,628 A | * | 7/2000 | Lim et al. .................... | 438/592 |
| 6,124,189 A | * | 9/2000 | Watanabe et al. ........... | 438/586 |
| 6,136,705 A | * | 10/2000 | Blair .......................... | 438/682 |
| 6,143,613 A | * | 11/2000 | Lin ............................. | 438/299 |
| 6,207,543 B1 | * | 3/2001 | Harvey et al. .............. | 438/586 |
| 6,236,094 B1 | * | 5/2001 | Wright ........................ | 257/413 |
| 6,326,251 B1 | * | 12/2001 | Gardner et al. ............. | 438/197 |
| 6,562,718 B1 | * | 5/2003 | Xiang et al. ................. | 438/682 |
| 2004/0121548 A1 | * | 6/2004 | Fishburn et al. ............ | 438/279 |
| 2004/0142546 A1 | * | 7/2004 | Kudo et al. .................. | 438/585 |
| 2005/0009279 A1 | * | 1/2005 | Fishburn et al. ............ | 438/275 |
| 2005/0009280 A1 | * | 1/2005 | Fishburn et al. ............ | 438/275 |
| 2005/0064646 A1 | * | 3/2005 | Chidambarrao et al. .... | 438/221 |

FOREIGN PATENT DOCUMENTS

EP           000991114 A2 *   7/1999   ........... H01L 21/28

* cited by examiner

*Primary Examiner*—Evan Pert
(74) *Attorney, Agent, or Firm*—Scully, Scott, Murphy & Presser; Robert M. Trepp, Esq.

(57) ABSTRACT

A CMOS silicide metal integration scheme that allows for the incorporation of silicide contacts (S/D and gates) and metal silicide gates using a self-aligned process (salicide) as well as one or more lithography steps is provided. The integration scheme of the present invention minimizes the complexity and cost associated with fabricating a CMOS structure containing silicide contacts and silicide gate metals.

26 Claims, 3 Drawing Sheets

METHOD FOR INTEGRATION OF SILICIDE CONTACTS AND SILICIDE GATE METALS

DESCRIPTION

1. Field of the Invention

The present invention relates to the fabrication of circuit devices on semiconductor substrates, and more particularly to a complementary metal oxide semiconductor (CMOS) transistor fabrication method for forming silicide contacts and silicide metal gates.

2. Background of the Invention

Throughout the prior art, metal gate integration has proven difficult to achieve in a conventional process flow for CMOS transistors. Most metal gate materials interact with the gate dielectric during the high temperature processing needed for source/drain (S/D) junction activation anneals. The need to keep the metal gate stack from receiving high temperature anneals has lead to the development of the "gate last" or "replacement gate" process for which the gate stack is fabricated last and remains below 500° C. during subsequent processing. Although the prior art replacement gate process increases the number of material choices for a metal gate, the process complexity and cost increases.

Co-assigned U.S. application Ser. No. 10/300,165, filed Nov. 20, 2002 describes an approach for forming a metal gate silicide in a conventional CMOS transistor processing flow in which the "replacement gate" process is not used. In this alternative approach, the number of added processing steps has been minimized therefore keeping the complexity to a minimum and cost down.

The avoidance of the "replacement gate" process is a big advantage. A second advantage to the alternative approach described in the '165 application is the ability to deposit the metal for forming the silicide metal gate via standard physical vapor deposition. Since the metal is not being directly deposited on the gate dielectric in the '165 application, there is no need for chemical vapor deposition (CVD) or atomic layer deposition (ALD), which keeps the gate dielectric damage to a minimum by eliminating the use of a plasma.

An additional advantage is the ease of passivation of the gate dielectric after silicide metal gate formation. Hydrogen readily diffuses through the silicide allowing passivation in a conventional furnace anneal process.

Current CMOS technology uses silicides as contacts to source/drain (S/D) and gate regions of the devices. Examples of silicides with low resistivity and contact resistance that are currently being used are the C54 phase of $TiSi_2$, $CoSi_2$, and NiSi. All three of these suicides are integrated using a self-aligned silicide process (i.e., a salicide process). This process consists of a blanket deposition of the metal (Ti, Co, or Ni) with a cap layer (such as TiN, Ti or W), annealing at a first lower temperature to form a first silicide phase (i.e., the C49 phase of $TiSi_2$, CoSi, or NiSi), selectively wet etching the cap layer and unreacted metal that is not in contact with silicon, and annealing at a second higher temperature to form the low resistant metal silicide phase (the C54 phase of $TiSi_2$ or $CoSi_2$). For the low resistance NiSi, the second anneal is not needed.

An additional approach for the Ni silicide is to form a metal rich Ni silicide during the first anneal followed by the formation of NiSi during the second anneal. The advantage of these particular silicides is that they all may be implemented with the self-aligned process avoiding additional lithographic steps.

In view of the above, there is still a need for providing an integration approach for which silicide contacts to S/D regions and gate regions as well as metal silicide gates may be integrated. Additionally, there is a need for providing an integration approach for which multiple silicide phases or silicide types may be implemented as gate metals and contacts.

SUMMARY OF THE INVENTION

The present invention provides a CMOS silicide metal integration scheme that allows for the incorporation of silicide contacts (S/D and gates) and metal silicide gates using a self-aligned process (salicide) as well as one or more lithography steps. The integration scheme of the present invention minimizes the complexity and cost associated in fabricating a CMOS structure containing silicide contacts and metal silicide gates.

The integration scheme of the present invention also allows for two or more different thicknesses of metal deposition on a semiconductor substrate such that on some of the CMOS transistors a thinner silicide metal is formed and used in the formation of gate contacts, whereas on other CMOS transistors a thicker silicide metal is formed and used in the formation of metal silicide gates. The integration scheme of the present invention can also be used to form multiple phases of metal silicide gates by varying the metal deposition thickness thus having differing amounts of metal present during metal gate formation.

An additional benefit of the present invention is that the integration scheme can be used for forming multiple silicide types of contacts and metal silicide gates.

As an example of different phases, by varying the Ni thickness some metal silicide gates can have a metal rich phase, while others may have the NiSi phase. As an example of different silicide types, $CoSi_2$ may be used as contacts to some devices where the gates are predominately doped polysilicon with a top silicide contact and NiSi may be used as metal silicide gates on other devices where all the gate polysilicon has been consumed.

The method of the present invention begins with providing a planarized structure that includes a plurality of patterned polysilicon gate regions located on a surface of a semiconductor substrate. The upper surface of each of the patterned polysilicon gates, i.e., the polysilicon gate conductor, is exposed. In the initial structure, each of the CMOS transistors contains polysilicon gate regions and silicided source/drain regions.

After providing such a structure, a first bilayer comprising a first metal-containing layer and a first capping layer is deposited on top of the planarized structure including the exposed upper surface of each patterned polysilicon gate region.

Next, the structure containing the first bilayer is patterned by lithography to expose some of the polysilicon gates, while leaving other polysilicon gates protected. A second bilayer comprising a second metal-containing layer and a second capping layer is then formed atop the structure. The second metal-containing layer is formed directly atop the exposed polysilicon gates.

Depending on the thickness of the first and second metal-containing layers as well as the type of metals used in those layers, one can tailor what is present in the final gate structure. Thus different silicide types and phases may be formed for gate contacts to polySi and metal gates.

A salicide process is then preformed which causes reaction between the first and second metal-containing layers

DETAILED DESCRIPTION OF THE INVENTION

Reference is made to FIGS. 1–5, which are cross sectional views of a semiconductor CMOS structure during various stages of the present invention. Although the drawings show the presence of two polysilicon gates (i.e., a CMOS transistor structure with pFET and nFET transistors), the present invention is not limited to that number of polySi gates. Instead, the present integration process works for any number of polySi gates. Hence, a plurality of polySi gates may be present across a single semiconductor structure.

It should be noted that FIGS. 1–5 show one possible embodiment of the present invention in which the first metal-containing layer is a thin layer that is used in forming silicide metal gate contacts, and the second metal-containing layer is a thicker metal layer that is used in the formation of metal silicide gates. Although this embodiment is illustrated, the present invention can be modified by changing the thickness and the types of metals that are being deposited in each bilayer. Thus enabling different types and phases of silicide gate contacts and silicide metal gates.

Figure 1:
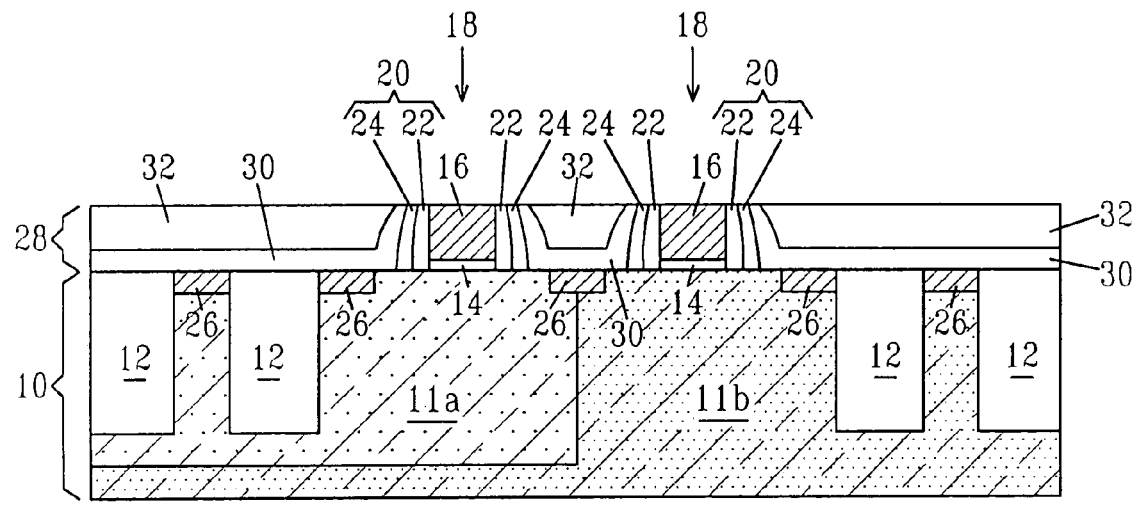
FIG. 1 is a pictorial representation (through a cross sectional view) illustrating an initial planarized structure including a plurality of polysilicon gate regions having silicided S/D regions.

FIG. 1 shows an initial planarized structure that is employed in the present invention. Specifically, the initial planarized structure shown in FIG. 1 comprises semiconductor substrate 10 having isolation regions 12 and silicided source/drain contacts 26 formed therein. The initial planarized structure of the present invention also includes a plurality of patterned polysilicon gate regions 18, each including a gate dielectric 14 and a polysilicon gate conductor 16, located on top of the semiconductor substrate 10. Each patterned polysilicon gate region 18 also includes at least one spacer 20 formed on each sidewall thereof. In the drawings, two spacers 22, 24 are shown.

The planarized structure also includes a planarized stack 28 that comprises a first dielectric 30 and a second dielectric 32 which are located atop the semiconductor substrate 10 in areas abutting the patterned polysilicon gate regions 18. The second dielectric 32 includes an upper surface that is coplanar with the upper surface of each patterned polysilicon gate region 18, i.e., the upper surface of each polysilicon gate conductor 16.

The semiconductor substrate 10 of the initial structure shown in FIG. 1 comprises any semiconducting material including, but not limited to: Si, Ge, SiGe, SiC, SiGeC, Ga, GaAs, InAs, InP and all other III/V compound semiconductors. Semiconductor substrate 10 may also comprise a layered semiconductor such as Si/SiGe, a silicon-on-insulator (SOI) or a SiGe-on-insulator (SGOI). In some embodiments of the present invention, it is preferred that the semiconductor substrate 10 be composed of a Si-containing semiconductor material. The semiconductor substrate 10 may be doped, undoped or contain doped and undoped regions therein.

In FIG. 1, reference numeral 11a refers to a first doped (n- or p-) region, and reference numeral 11b refers to a second doped (n- or p-) region. The first doped region and the second doped region may be the same, or they may have different conductivities. These I/I doped regions are known as "wells".

The isolation regions 12 are then formed into the semiconductor substrate 10. The isolation regions 12 may be trench isolation regions, as shown, or field oxide isolation regions. The trench isolation regions are formed utilizing a conventional trench isolation process well known to those skilled in the art. For example, lithography, etching and filling of the trench with a trench dielectric may be used in forming the trench isolation regions. Optionally, a liner may be formed in the trench prior to trench fill, a densification step may be performed after the trench fill and a planarization process may follow the trench fill as well. The field oxide regions may be formed utilizing a so-called local oxidation of silicon process.

After forming the isolation regions 12 within the semiconductor substrate 10, gate dielectric 14 is formed on the entire surface of the structure including the semiconductor substrate 10 and atop the isolation regions 12, if it is a deposited dielectric. The gate dielectric 14 can be formed by a thermal growing process such as, for example, oxidation, nitridation or oxynitridation. Alternatively, the gate dielectric 14 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric 14 may also be formed utilizing any combination of the above processes.

The gate dielectric 14 is comprised of an insulating material including, but not limited to: an oxide, nitride, oxynitride and/or silicate. In one embodiment, it is preferred that the gate dielectric 14 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof, including the addition of silicon and nitrogen.

The physical thickness of the gate dielectric 14 may vary, but typically, the gate dielectric 14 has a thickness from about 0.5 to about 10 nm, with a thickness from about 0.5 to about 3 nm being more typical.

After forming the gate dielectric 14, a blanket layer of polysilicon 16 (i.e., polySi) is formed on the gate dielectric 14 utilizing a known deposition process such as physical vapor deposition (PVD), CVD or evaporation. The blanket layer of polysilicon 16 may be doped or undoped. If doped, an in-situ doping deposition process may be employed in forming the same. Alternatively, a doped polySi layer 16 can be formed by deposition, ion implantation and annealing.

The doping of the polySi layer 16 will shift the workfunction of the silicide gate formed. Illustrative examples of doping ions include As, P, B, Sb, Bi, In, Al, Tl, Ga or mixtures thereof. The thickness, i.e., height, of the polysilicon layer 16 deposited at this point of the present invention may vary depending on the deposition process employed. Typically, the polysilicon layer 16 has a vertical thickness from about 20 to about 180 nm, with a thickness from about 40 to about 150 nm being more typical.

The blanket polysilicon layer 16 (and optionally the gate dielectric 14) is then patterned by lithography and etching so as to provide patterned polysilicon gate regions 18. The patterned polysilicon gate regions 18 may have the same dimension, i.e., length, or they can have variable dimensions to improve device performance. The lithography step includes applying a photoresist to the upper surface of the blanket deposited polysilicon 16, exposing the photoresist to a desired pattern of radiation and developing the exposed photoresist utilizing a conventional resist developer. The pattern in the photoresist is then transferred to the blanket layer of polysilicon 16 utilizing a dry etching process. The patterned photoresist is removed after etching has been completed. In some embodiments, a hardmask may be formed prior to formation of the photoresist and used in patterning the blanket layer of polysilicon 16.

Suitable dry etching processes that can be used in the present invention in forming the patterned polysilicon gate regions 18 include, but are not limited to: reactive ion etching, ion beam etching, plasma etching or laser ablation. The dry etching process employed is typically selective to the underlying gate dielectric 14 therefore this etching step does not typically remove the gate dielectric 14. In some embodiments, this etching step may however be used to remove portions of the gate dielectric 14 that are not protected by the patterned polysilicon gate regions 18.

Next, at least one spacer 20 is formed on exposed sidewalls of each patterned polysilicon gate regions 18. The at least one spacer 20 is comprised of an insulator such as an oxide, nitride, oxynitride and/or any combination thereof. The at least one spacer 20 is formed by deposition and etching. In the drawings, two spacers are illustrated.

In particular, FIG. 1 shows a structure including first spacer 22 having a first width and second spacer 24 having a second width wherein the first width is narrower than the second width. In another embodiment, the two-spacer scheme is replaced by a single spacer in which the single spacer is a wide spacer having a width that is substantially equal to the sum of the first and second widths shown in FIG. 1.

When first and second spacers are used, the first and second spacers are composed of different insulators. For example, the first spacer 22 may be comprised of $SiO_2$ and the second spacer 24 may be comprised of $Si_3N_4$.

The width of the spacers must be sufficiently wide enough such that the source/drain silicide contacts (to be subsequently formed) do not encroach underneath the edges of the polysilicon gate conductor 16 into the channel region of the transistor. Typically, the source/drain silicide contacts do not encroach underneath the edges of the gate stack when the spacers have a width, as measured at the bottom, from about 20 to about 80 nm.

After spacer formation, source/drain diffusion regions (not specifically shown) are formed into the substrate. The source/drain diffusion regions are formed utilizing ion implantation and an annealing step. The annealing step serves to activate the dopants that were implanted by the previous implant step. The conditions for the ion implantation and annealing are well known to those skilled in the art.

Next, and if not previously removed, the exposed portion of the gate dielectric 14 is removed utilizing a chemical etching process that selectively removes the gate dielectric 14. This etching step stops on an upper surface of the semiconductor substrate 10 as well as an upper surface of the isolation regions 12. Although any chemical etchant may be used in removing the exposed portions of the gate dielectric 14, in one embodiment dilute hydrofluoric acid (DHF) is used.

Source/drain (S/D) silicide contacts 26 are then formed using a salicide process which includes the steps of depositing a metal on an exposed surface of the semiconductor substrate 10 that includes the source/drain diffusion regions, first annealing to form a metal silicide, selective etching any non-reacted metal and, if needed, performing a second annealing step. An insulating cap layer may be used atop the polySi gate regions 16 to prevent gate silicidation during the S/D silicidation step.

When the semiconductor substrate 10 does not include silicon, a layer of silicon (not shown) can be grown atop the exposed surface of the semiconductor substrate 10 and can be used in forming the source/drain silicide contacts 26.

The metal used in forming the source/drain silicide contacts 26 comprises any metal that is capable of reacting with silicon to form a metal silicide. Examples of such metals include, but are not limited to: Ti, Ta, W, Co, Ni, Pt, Pd and alloys thereof. In one embodiment, Co is a preferred metal. In such an embodiment, the second annealing step is required. In another embodiment, Ni or Pt is preferred. In this embodiment, the second annealing step is typically not performed.

The metal may be deposited using any conventional deposition process including, for example, sputtering, chemical vapor deposition, evaporation, chemical solution deposition, plating and the like.

The first anneal is typically performed at lower temperatures than the second annealing step. Typically, the first annealing step, which may, or may not, form a high resistance silicide phase material, is performed at a temperature from about 300° to about 600° C. using a continuous heating regime or various ramp and soak heating cycles. More preferably, the first annealing step is performed at a temperature from about 350° to about 550° C. The second annealing step is performed at a temperature from about 600° C. to about 800° C. using a continuous heating regime or various ramp and soak heating cycles. More preferably, the second annealing step is performed at a temperature from about 650° C. to about 750° C. The second anneal typically converts the high resistance silicide into a silicide phase of lower resistance.

The salicide anneals are carried out in a gas atmosphere, e.g., He, Ar, $N_2$ or forming gas. The source/drain silicide contact annealing steps may use different atmospheres or the annealing steps may be carried out in the same atmosphere. For example, He may be used in both annealing steps, or He can be used in the first annealing step and a forming gas may be used in the second annealing step.

The selective etching step includes any conventional etching process that can selectively remove non-reacted metal. Examples include wet etching using a sulfuric acid/hydrogen peroxide solution.

A patterned dielectric stack 28 comprising a first dielectric layer 30 and a second dielectric layer 32 is then provided. The first dielectric layer 30 serves an etch stop layer, while the second dielectric layer 32 serves as an interlevel dielectric. The first and second dielectric layers of the patterned dielectric stack 28 are composed of different insulating materials including, for example, oxides, nitrides and oxynitrides.

In one embodiment of the present invention, first dielectric layer 30 of the dielectric stack is comprised of $Si_3N_4$, while the second dielectric layer 32 is comprised of $SiO_2$. As shown, the patterned dielectric stack 28 covers the isolation regions 12, and the source/drain silicide contacts 26, while leaving an upper surface of each patterned polysilicon gate region 20 exposed. Specifically, the exposed upper surface is an upper surface of the polysilicon gate conductor 16.

The first dielectric layer 30 and the second dielectric 32 are formed utilizing the same or different deposition process. Examples of suitable deposition processes that can be used in forming layers 30 and 32 of the dielectric stack include, but are not limited to: chemical vapor deposition, atomic layer deposition, physical vapor deposition, chemical solution deposition, evaporation and other like deposition processes. The original thickness of the dielectric stack, prior to planarization, may vary, but it must have a thickness that is higher than the height of polysilicon gate regions 16.

After formation of the first and second dielectric layers, the second dielectric layer 32 is planarized by a conventional planarization process including, for example, chemical mechanical polishing and/or grinding.

Figure 2:
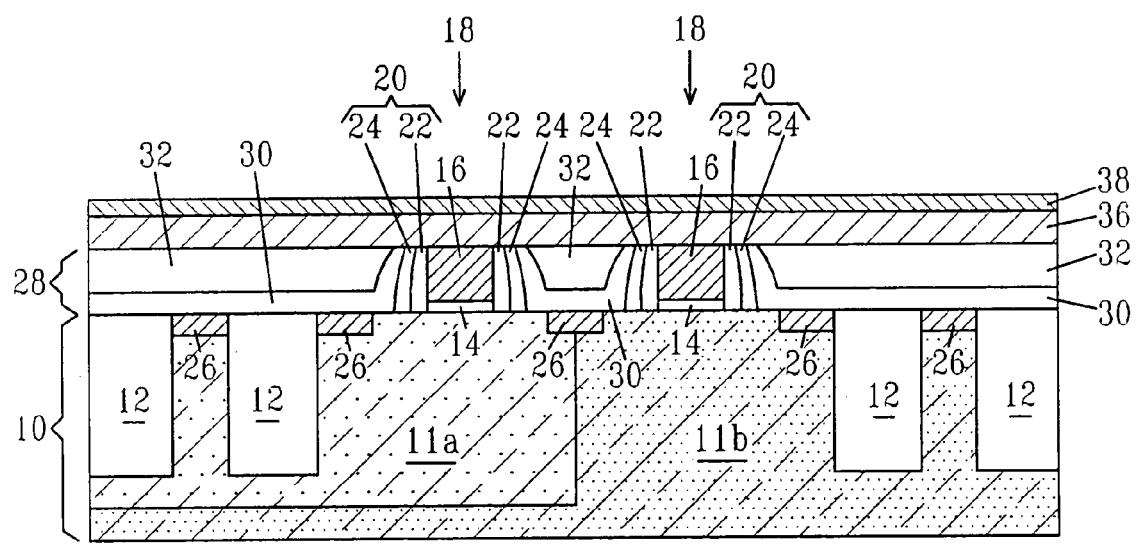
FIG. 2 is a pictorial representation (through a cross sectional view) illustrating the structure of FIG. 1 including a first bilayer comprising a first metal-containing layer and a first capping layer.

Next, and as shown, for example, in FIG. 2a first bilayer 34 is formed atop the entire structure shown in FIG. 1. The first bilayer 34 comprises a first metal-containing layer 36 and a first capping layer 38. As shown in FIG. 2, the first metal-containing layer 36 is formed first and thereafter the first capping layer 38 is formed. Depending on the thickness of the first metal-containing layer 36, the first metal-containing layer 36 can be used in the present invention in forming either silicide gate contacts or silicide metal gates.

The first metal-containing layer 36 of first bilayer 34 is composed of any metal that is capable of reacting with polysilicon to form a metal silicide. Examples of such metals include, but are not limited to: Ni, Co, Pt, Ti, W, Mo, Ta or alloys thereof. A stack of these metals may also be used as the first metal-containing layer 36. Of these various metals it is preferred that Co or Ni be employed.

In some embodiments of the present invention, the metal contained with the first metal-containing layer 36 may include an alloying additive that can enhance the formation of a metal silicide. Examples of alloying additives that may be employed in the present invention include: C, Al, Ti, V, Cr, Mn, Fe, Co, Ni, Cu, Ge, Zr, Nb, Mo, Ru, Rh, Pd, Ag, In, Sn, Hf, Ta, W, Re, Ir, Pt or mixtures thereof, with the proviso that the alloying additive is not the same as the metal within the first metal-containing layer 36. When present, the alloying additive is present in an amount from about 0.1 to about 50 atomic percent.

In one embodiment, the first metal-containing layer 36 of the first bilayer 34 is a thin layer whose thickness is typically from about 5 to about 15 nm, with a thickness from about 8 to about 12 nm being more typical. In another embodiment of the present invention, the first metal-containing layer 36 of the first bilayer 34 is a thick layer whose thickness is typically from about to about 100 nm, with a thickness from about 10 to about 60 nm being more typical.

The first metal-containing layer 36 of the first bilayer 34 is formed utilizing any conventional deposition process including, for example, sputtering, chemical vapor deposition, evaporation, chemical solution deposition, plating and the like.

The first capping layer 38 of the first bilayer 34, which is formed atop the first metal-containing layer 36, includes any material that can prevent oxygen incorporation into the underlying metal used to form the silicide. Illustrative examples of such capping layers include TiN, W, or Ti. The first capping layer 38 typically has a thickness from about 5 to about 50 nm, with a thickness from about 10 to about 25 nm being more typical. The first capping layer 38 is formed utilizing a conventional deposition process such as, for example, physical vapor deposition or chemical vapor deposition.

Next, a photoresist is applied to the structure shown in FIG. 2 and then the applied photoresist is subjected to lithography which provides a patterned photoresist 40 (See, FIG. 3) that exposes portions of the first bilayer 34 that overlay preselected patterned polysilicon gates 20, while protecting other patterned polysilicon gates 20. The exposed material, i.e., the first bilayer 34, that overlays the preselected patterned polysilicon gates is then removed to expose at least a polysilicon-containing surface of each preselected polysilicon gate 20. Specifically, the exposed portions of the first capping layer 38 are first removed and thereafter the underlying first metal-containing layer 36 is removed.

The removal process is performed utilizing a wet etching process that selectively removes the exposed portions of the first capping layer 38 and then the underlying first metal-containing layer 36, while stopping on a surface of underlying polysilicon gate 16 as well as the second dielectric 32. As an example, the wet etching process may include the use of an etchant comprising 20 parts $H_2O$, 1 part $H_2O_2$, and 1 part HCl. Note that the wet etching process should remove exposed first capping layer 38 and the underlying first metal-containing layer 36 selectively without causing damage to the patterned photoresist 40.

Figure 3:
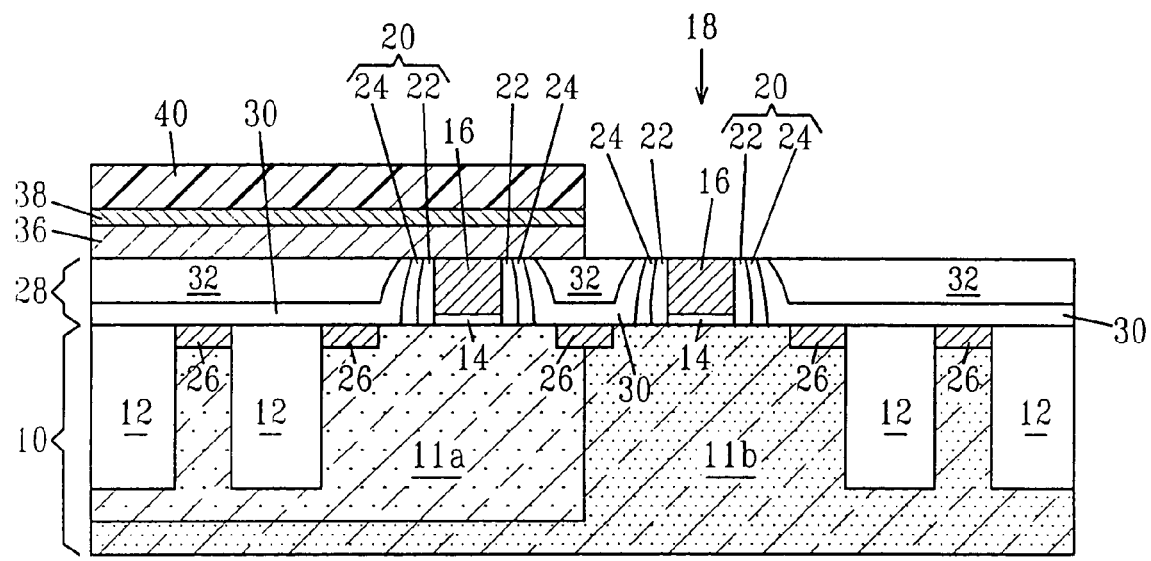
FIG. 3 is a pictorial representation (through a cross sectional view) illustrating the structure shown in FIG. 2 after selectively patterning the first bilayer exposing preselected patterned polysilicon gate regions.

FIG. 3 shows the structure that is formed after the wet etching process. In the illustrated structure, a polysilicon-containing surface of a preselected polysilicon gate 16 is exposed, while the other gate region is protected by the overlying patterned photoresist 40.

In an alternative embodiment not shown, a low-temperature oxide (LTO) is formed on the first capping layer 38 prior to forming the photoresist on the structure. After the photoresist is patterned by lithography, the LTO is removed from the exposed preselected polysilicon gate regions with a wet HF etch. After photoresist removal, the LTO is used as a hardmask for the removal of the exposed first capping layer 38 and underlying first metal-containing layer 36 by a wet etch or a reactive ion etch process.

When the etch of the exposed first capping layer 38 and underlying first metal-containing layer 36 is completed on the preselected polysilicon gate regions 20, the patterned photoresist 40 or the LTO is removed utilizing a conventional stripping process well known to those skilled in the art.

At this point of the present invention, the exposed polysilicon surfaces 16 of each of the preselected polysilicon gates 16 should be cleaned so as to remove silicon oxide from atop the exposed polysilicon surfaces. Any cleaning process that is capable of removing silicon oxide may be employed in the present invention. An example of such a cleaning process is a dilute hydrofluoric acid.

Figure 4:
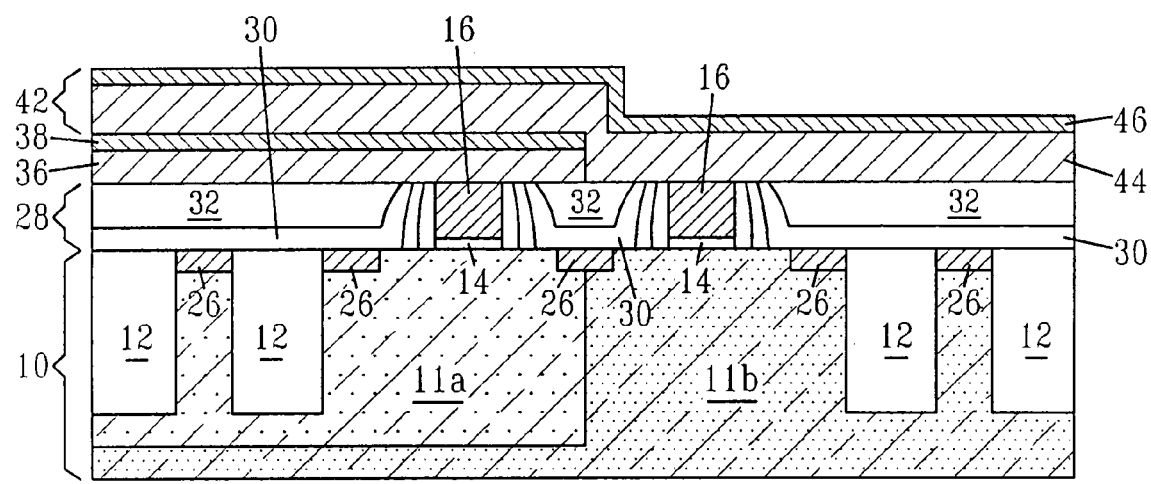
FIG. 4 is a pictorial representation (through a cross sectional view) illustrating the structure shown in FIG. 3 after forming a second bilayer comprising a second metal-containing layer and a second capping layer.

FIG. 4 shows the structure that is formed after a second bilayer 42 is formed on the structure shown in FIG. 3. The second bilayer 42 comprises a second metal-containing layer 44 and a second capping layer 46. As shown in FIG. 4, the second metal-containing layer 44 is formed first and thereafter the second capping layer 46 is formed. The second metal-containing layer 44 can be used in the present invention in forming either the silicide gate contacts or the silicide metal gates.

The second metal-containing layer 44 of the second bilayer 42 is composed of any metal that is capable of reacting with polysilicon to form a metal silicide. The second metal-containing layer 44 may be comprised of the same or different metal as the first metal-containing layer 36. Examples of such metals that can be used as the second metal-containing layer 44 include, but are not limited to: Ni, Co, Pt, Ti, W, Mo, Ta or alloys thereof. The present invention also contemplates a stack of these metals as the second-containing metal layer 44. Of these various metals it is preferred that Co or Ni be employed as the second metal-containing layer 44.

In some embodiments of the present invention, the metal contained with the second metal-containing layer 44 may include an alloying additive that may enhance the formation of a metal silicide. Examples of alloying additives that may be employed in the present invention include: C, Al, Ti, V, Cr, Mn, Fe, Co, Ni, Cu, Ge, Zr, Nb, Mo, Ru, Rh, Pd, Ag, In, Sn, Hf, Ta, W, Re, Ir, Pt or mixtures thereof, with the proviso that the alloying additive is not the same as the metal within the second metal-containing layer 44. When present, the alloying additive is present in an amount from about 0.1 to about 50 atomic percent.

In one embodiment of the present invention, the second metal-containing layer 44 has a thickness that is greater than the thickness of the first metal-containing layer 36. In that embodiment, the second metal-containing layer 44 has a thickness from about 5 to about 100 nm, with a thickness from about 10 to about 60 nm being more typical.

In another embodiment of the present invention, the second metal-containing layer 44 has a thickness that is less than the thickness of the first metal-containing layer 36. In that embodiment, the second metal-containing layer 44 has a thickness from about 5 to about 15 nm, with a thickness from about 8 to about 12 nm being more typical.

In still another embodiment of the present invention, the second metal-containing layer 44 has a thickness that is substantially equivalent to the thickness of the first metal-containing layer 36.

The second metal-containing layer 44 is formed utilizing any conventional deposition process including, for example, sputtering, chemical vapor deposition, evaporation, chemical solution deposition, plating and the like.

The second capping layer 46 of the second bilayer 42 includes any material that can prevent oxygen incorporation into the underlying metal used to from the silicide. Illustrative examples of such capping layers include TiN, W, or Ti. The second capping layer 46 typically has a thickness from about 5 to about 50 nm, with a thickness from about 10 to about 25 nm being more typical. The second capping layer 46 is formed utilizing a conventional deposition process such as, for example, physical vapor deposition or chemical vapor deposition.

Figure 5:
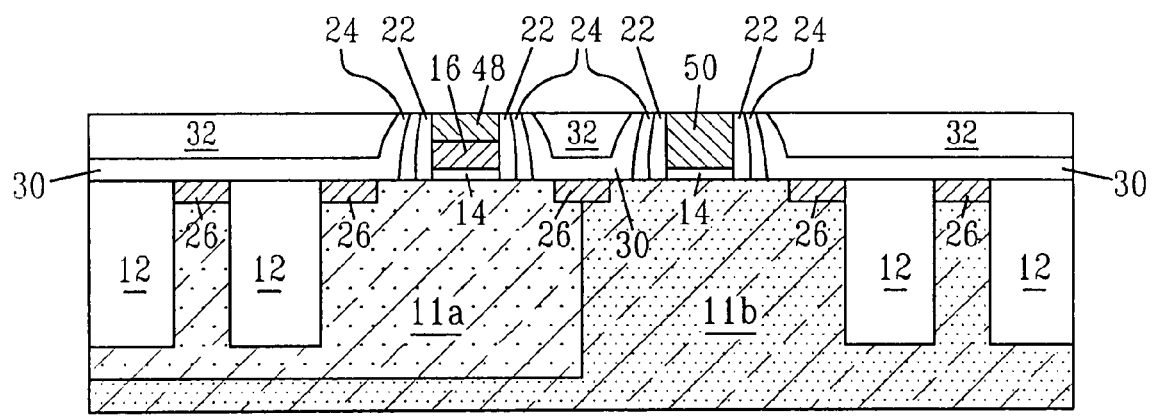
FIG. 5 is a pictorial representation (through a cross sectional view) illustrating the structure after performing a salicide process for formation of silicided contacts and gates.

In one embodiment of the present invention, the processing steps shown in FIGS. 3–5 can be repeated multiple times to form multiple silicide types or phases for the gate contacts and metal silicide gates. If different silicide types are used, it is important to be aware that the annealing temperatures and thermal degradation temperatures may be different.

FIG. 5 illustrates the CMOS device after formation of silicide contacts 48 atop one of the patterned polysilicon gates, and formation of a metal silicide gate 50. Specifically, the silicides illustrated in FIG. 5 are formed using a salicide process that includes a first anneal at a first temperature which is sufficient to form a metal silicide, a selective etch to remove non-reacted metal and capping layers, and optionally a second anneal at a second temperature which is sufficient to form the lowest possible resistivity silicide phases.

The first anneal is typically performed at lower temperatures than the second annealing step. Typically, the first annealing step, which may, or may not, form a high resistance silicide phase material, is performed at a first temperature from about 300° to about 600° C. using a continuous heating regime or various ramp and soak heating cycles. More preferably, the first annealing step is performed at a first temperature from about 350° to about 550° C. The second annealing step is performed at a second temperature from about 600° C. to about 800° C. using a continuous heating regime or various ramp and soak heating cycles. More preferably, the second annealing step is performed at a second temperature from about 650° C. to about 750° C. The second anneal typically converts the high resistance silicide into a silicide phase of lower resistance. The salicide anneals are carried out in a gas atmosphere, e.g., He, Ar, $N_2$ or forming gas. The same or different atmospheres can be employed in the first and second anneals.

The selective etch process employed in the salicide process includes any etching process that removes unreacted metal and capping layers from the structure. Examples of selective etching processes that can be used include, wet etching using a sulfuric acid/hydrogen peroxide solution or combinations thereof.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of forming a complementary metal oxide semiconductor structure comprising:
   providing a planarized structure comprising a plurality of patterned polysilicon gate regions, each having an exposed upper polysilicon-containing surface, located atop a substrate, said substrate having silicided source/drain contacts formed therein;
   forming a first bilayer comprising a first metal-containing layer, said first metal-containing layer in contact with the exposed upper polysilicon-containing surface of each patterned polysilicon gate region;
   patterning said first bilayer to provide a patterned structure in which the first bilayer is removed from preselected patterned polysilicon gate regions;
   forming a second bilayer comprising a second metal-containing layer over the patterned structure, said second metal-containing layer in contact with an exposed upper polysilicon-containing surface of each preselected patterned polysilicon gate regions; and
   performing a salicide process that converts the first and second metal-containing layers into metal silicides.

2. The method of claim 1 wherein the providing the planarized structure comprises the steps of:
   forming patterned polysilicon gate regions atop the substrate, forming the silicided source/drain contacts in the substrate, forming a dielectric stack comprising a first dielectric and a second dielectric atop the substrate and the patterned polysilicon gate regions and planarizing the second dielectric.

3. The method of claim 2 further comprising forming at least one spacer about each patterned polysilicon gate region.

4. The method of claim 3 wherein said at least one spacer has a thickness that is sufficient to prevent encroachment of said silicide source/drain contacts underneath said patterned polysilicon gate region.

5. The method of claim 1 wherein the plurality of patterned polysilicon gate regions comprises a polysilicon gate conductor that is doped.

6. The method of claim 5 wherein the polysilicon gate conductor is doped with a dopant selected from As, P, B, Sb, Bi, In, Al, Tl, Ga and mixtures thereof.

7. The method of claim 1 wherein the silicided source/drain regions are formed using a salicide process which comprises depositing a metal atop activated source/drain regions located in the substrate, first annealing to form a metal silicide, selectively etching non-reacted metal, and optionally performing a second anneal.

8. The method of claim 7 wherein the metal is selected from the group consisting of Ti, Ta, W, Co, Ni, Pt, Pd and alloys thereof.

9. The method of claim 7 wherein the first annealing is performed at a temperature from about 300° C. to about 600° C. in He, Ar, $N_2$ or forming gas.

10. The method of claim 7 wherein the optional second anneal is performed at a temperature from about 600° C. to about 800° C. in He, Ar, $N_2$ or forming gas.

11. The method of claim 1 wherein the first metal-containing layer comprises a metal selected from the group consisting of Ni, Co, Pt, Ti, W, Mo, Ta, and alloys thereof.

12. The method of claim 11 wherein the first metal-containing layer comprises Co or Ni.

13. The method of claim 11 wherein the first metal-containing layer further comprises an alloying additive.

14. The method of claim 13 wherein the alloying additive is selected from the group consisting of C, Al, Ti, V, Cr, Mn, Fe, Co, Ni, Cu, Ge, Zr, Nb, Mo, Ru, Rh, Pd, Ag, In, Sn, Hf, Ta, W, Re, Ir, Pt and mixtures thereof.

15. The method of claim 1 wherein the first metal-containing layer is used in the formation of silicide gate contacts.

16. The method of claim 1 wherein the first metal-containing layer is used in the formation of metal silicide gates.

17. The method of claim 1 wherein the patterning comprises lithography and etching.

18. The method of claim 1 wherein the second metal-containing layer comprises a metal selected from the group consisting of Ni, Co, Pt, Ti, W, Mo, Ta, and alloys thereof.

19. The method of claim 18 wherein the second metal-containing layer comprises Co or N.

20. The method of claim 18 wherein the second metal-containing layer further comprises an alloying additive.

21. The method of claim 20 wherein the alloying additive is selected from the group consisting of C, Al, Ti, V, Cr, Mn, Fe, Co, Ni, Cu, Ge, Zr, Nb, Mo, Ru, Rh, Pd, Ag, In, Sn, Hf, Ta, W, Re, Ir, Pt and mixtures thereof.

22. The method of claim 1 wherein the second metal-containing layer is used in the formation of silicide gate contacts.

23. The method of claim 1 wherein the second metal-containing layer is used in the formation of metal silicide gates.

24. The method of claim 1 wherein the salicide process comprises first annealing to form a metal silicide, selectively etching non-reacted metal, and optionally performing a second anneal.

25. The method of claim 24 wherein the first annealing is performed at a temperature from about 300° C. to about 600° C. in He, Ar, $N_2$ or forming gas.

26. The method of claim 24 wherein the optional second anneal is performed at a temperature from about 600° C. to about 800° C. in He, Ar, $N_2$ or forming gas.

* * * * *

UNITED STATES PATENT AND TRADEMARK OFFICE
CERTIFICATE OF CORRECTION

PATENT NO.   : 6,927,117 B2
DATED        : August 9, 2005
INVENTOR(S)  : Cyril Cabra et al.

It is certified that error appears in the above-identified patent and that said Letters Patent is hereby corrected as shown below:

Column 2,
Line 66, "process is then preformed" should read -- process is then performed --.

Column 7,
Line 11, "gate region 20" should read -- gate region 16 --.
Line 27, "in FIG 2a first" should read -- in FIG 2 a first --.

Column 8,
Line 51, "gate regions 20" should read -- gate regions 16 --.
Line 56, "16" should be deleted.

Signed and Sealed this

Fourth Day of October, 2005

JON W. DUDAS
*Director of the United States Patent and Trademark Office*